United States Patent
Satoh et al.

(10) Patent No.: US 9,299,653 B2
(45) Date of Patent: Mar. 29, 2016

(54) ELECTRONIC COMPONENT AND METHOD FOR PRODUCING SAME

(75) Inventors: Minoru Satoh, Chuo-ku (JP); Takehiro Yamashita, Miyoshi (JP); Atsushi Nagai, Miyoshi (JP); Yasuo Adachi, Miyoshi (JP)

(73) Assignees: TDK CORPORATION, Tokyo (JP); NORITAKE CO., LTD., Nagoya (JP)

( * ) Notice: Subject to any disclaimer, the term of this patent is extended or adjusted under 35 U.S.C. 154(b) by 146 days.

(21) Appl. No.: 13/696,862

(22) PCT Filed: May 9, 2011

(86) PCT No.: PCT/JP2011/060658
§ 371 (c)(1),
(2), (4) Date: Nov. 8, 2012

(87) PCT Pub. No.: WO2011/142318
PCT Pub. Date: Nov. 17, 2011

(65) Prior Publication Data
US 2013/0058061 A1   Mar. 7, 2013

(30) Foreign Application Priority Data
May 11, 2010 (JP) .................. 2010-109596

(51) Int. Cl.
H05K 7/04 (2006.01)
H01B 1/02 (2006.01)
(Continued)

(52) U.S. Cl.
CPC ............ *H01L 23/49883* (2013.01); *H01B 1/16* (2013.01); *H01L 24/48* (2013.01);
(Continued)

(58) Field of Classification Search
CPC ............ H05K 7/04; H05K 7/06; H01B 1/02; H01K 13/04
USPC .......... 361/776, 794, 750, 762; 174/256, 258, 174/260–261
See application file for complete search history.

(56) References Cited

U.S. PATENT DOCUMENTS 6,277,169 B1   8/2001   Hampden-Smith et al.
2004/0070915 A1   4/2004   Nagai et al.
(Continued)

FOREIGN PATENT DOCUMENTS

CN   1494820 A   5/2004
JP   57192040 A   * 11/1982
(Continued)

OTHER PUBLICATIONS

International Search Report issued in International Patent Application No. PCT/JP2011/060658 dated May 31, 2011.
(Continued)

*Primary Examiner* — Jenny L Wagner
*Assistant Examiner* — Michael P McFadden
(74) *Attorney, Agent, or Firm* — Oliff PLC (57) ABSTRACT

This electronic component is provided with an inorganic substrate, a conductor film formed on a surface of the substrate, and bonding wires bonded to a part of said conductor film, and wire bonding sections are formed on at least a part of the electronic component. The part of the conductor film at least forming the aforementioned wire bonding sections contains an Ag-based metal formed of Ag or an alloy having Ag as the main constituent and a metal oxide which coats said Ag-based metal and which has, as a constituent element, any of the elements selected from the group consisting of Al, Zr, Ti, Y, Ca, Mg, and Zn. The coating quantity of the metal oxide is a quantity corresponding to 0.02 to 0.1 parts by mass relative to 100 parts by mass of the aforementioned Ag-based metal.

22 Claims, 3 Drawing Sheets (51) Int. Cl.
*H01L 23/498* (2006.01)
*H01B 1/16* (2006.01)
*H01L 23/00* (2006.01)
*H01K 13/04* (2006.01)
*H01L 23/15* (2006.01)

(52) U.S. Cl.
CPC ............... *H01L 23/15* (2013.01); *H01L 24/45* (2013.01); *H01L 2224/45015* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48599* (2013.01); *H01L 2224/48699* (2013.01); *H01L 2224/859* (2013.01); *H01L 2224/85399* (2013.01); *H01L 2924/0102* (2013.01); *H01L 2924/0103* (2013.01); *H01L 2924/0104* (2013.01); *H01L 2924/014* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01014* (2013.01); *H01L 2924/01025* (2013.01); *H01L 2924/01028* (2013.01); *H01L 2924/01029* (2013.01); *H01L 2924/01033* (2013.01); *H01L 2924/01038* (2013.01); *H01L 2924/01041* (2013.01); *H01L 2924/01045* (2013.01); *H01L 2924/01046* (2013.01); *H01L 2924/01047* (2013.01); *H01L 2924/01072* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12044* (2013.01); *H01L 2924/15787* (2013.01)

(56) References Cited

U.S. PATENT DOCUMENTS

| | | | |
|---|---|---|---|
| 2004/0238866 A1* | 12/2004 | Iwashita et al. | 257/296 |
| 2004/0245507 A1 | 12/2004 | Nagai et al. | |
| 2006/0145352 A1* | 7/2006 | Soga et al. | 257/772 |
| 2008/0274588 A1* | 11/2008 | Ogata | H01L 24/32 438/107 |
| 2010/0155374 A1* | 6/2010 | Rabinovich | 219/121.14 |

FOREIGN PATENT DOCUMENTS

| | | | |
|---|---|---|---|
| JP | 02172243 A * | 7/1990 | |
| JP | H05-343561 A | 12/1993 | |
| JP | A-2004-55554 | 2/2004 | |
| JP | A-2004-179010 | 6/2004 | |
| JP | 3564089 B2 * | 9/2004 | |
| JP | A-2004-273426 | 9/2004 | |
| JP | B2-3564089 | 9/2004 | |
| JP | A-2007-294731 | 11/2007 | |

OTHER PUBLICATIONS

International Preliminary Report on Patentability issued in International Patent Application No. PCT/JP2011/060658 dated Dec. 10, 2012.

Dec. 12, 2014 Office Action issued in Chinese Application No. 201180023628.8.

Feb. 17, 2015 Search Report issued in European Application No. 11780575.4.

Jul. 15, 2015 Notification of Second Office Action issued in Chinese Application No. 201180023628.8.

* cited by examiner

ELECTRONIC COMPONENT AND METHOD FOR PRODUCING SAME

TECHNICAL FIELD

The present invention relates to an electronic component provided with a wet plating-less conductor film, and a method for producing same. The present invention also relates to a material used to form the conductor film.

Moreover, the present application claims priority on the basis of Japanese Patent Application No. 2010-109596, which was filed on 11 May 2010, and all the details of that application are incorporated by reference in the present specification.

Conductor film-forming materials which contain a powdered material that constitutes a film and which are formed as a paste (or a slurry or ink) (hereinafter, a conductor film-forming material (composition) having such fluidity is referred to as a "conductor paste") are used as materials that form a conductor film having a prescribed pattern (wiring, electrode and the like) on a substrate (for example, a ceramic substrate) used to constitute an electronic component such as a hybrid IC or a multichip module (which typically include a semiconductor element). An example of this type of conductor paste is one prepared by dispersing a powder of Ag or an alloy mainly comprising Ag (for example, an Ag—Pd alloy or Ag—Pt alloy), which is the main component that forms the conductor, and a variety of additives (such as an inorganic oxide or glass powder), which are added if necessary, in a prescribed organic solvent (a vehicle) (hereinafter, this type of paste is referred to as an "Ag-based paste"). For example, Patent Literature 1 discloses an example of this type of conductor paste.

Here, when electronically bonding (connecting) a conductor film formed from this type of Ag-based paste and, for example, a semiconductor chip soldered in advance to a substrate (for example, when bonding an aluminum electrode (such as a bonding pad section) on a semiconductor chip to a conductor film (wiring formed as a pattern) on a substrate), it is unlikely that satisfactory connection strength can be achieved between the bonding wires and the conductor film. If the connection strength is low, problems such as bonding wires detaching at bonding parts can occur, and connection reliability cannot be satisfactorily ensured.

As a result, in order to achieve the required connection strength (wire bonding properties), methods such as carrying out wet plating using electroless Ni/Au or electroless Ni/Pd/Au plating on the surface of a conductor film constituted from Ag were used in the past.

CITATION LIST

Patent Literature

Patent Literature 1: Japanese Patent Publication No. 3564089

SUMMARY OF INVENTION

However, carrying out metal soldering treatment on the surface of a conductor film separately in this way makes the electronic component manufacturing process more complicated, and is therefore not preferred. In addition, carrying out an excessive degree of electroless plating (wet plating) is likely to bring about a deterioration in the mechanical strength or electrical characteristics of the electronic component. Moreover, the conductor paste disclosed in Patent Literature 1 mentioned above does not focus on wire bonding in particular. In addition, in cases where an electronic component mounted by means of soldering and an electronic component mounted by means of wire bonding are both present on the same substrate, it is necessary to use a suitable conductor paste for each electronic component, meaning that more steps are required in order to form the conductor films.

As a result, the present invention was devised in order to solve the above-mentioned problems inherent in the prior art, and an objective of the present invention is to provide an electronic component provided with a wet plating-less conductor film having excellent wire bonding properties on a surface of the substrate, and a method for producing the electronic component. In addition, another objective of the present invention is to provide a material that forms a wet plating-less conductor film having excellent wire bonding properties, which is used in order to constitute this type of electronic component. In addition, another objective of the present invention is to provide a conductor film-forming material able to mount an electronic component by means of soldering and an electronic component by means of wire bonding on a substrate by using the same conductor film-forming material.

In order to achieve the above-mentioned objectives, the present invention provides an electronic component which is provided with an inorganic substrate, a conductor film formed on a surface of the substrate, and bonding wires bonded to a part of the conductor film, and in which wire bonding sections are formed on at least a part of the electronic component. In the electronic component disclosed here, at least the part of the above-mentioned conductor film forming the above-mentioned wire bonding sections contains an Ag-based metal formed of Ag or an alloy having Ag as the main constituent and a metal oxide which coats said Ag-based metal and which has, as a constituent element, any of elements selected from the group consisting of aluminum (Al), zirconium (Zr), titanium (Ti), yttrium (Y), calcium (Ca), magnesium (Mg), and zinc (Zn), and the coating quantity of the above-mentioned metal oxide is a quantity corresponding to 0.02 to 0.1 parts by mass relative to 100 parts by mass of the above-mentioned Ag-based metal.

Moreover, in the present specification, "electronic component" generally means an electronic component having an inorganic substrate (typically a crystalline (that is, non-vitreous) ceramic substrate or a non-crystalline ceramic substrate (that is, a glass ceramic substrate)). Therefore, hybrid ICs, multichip modules and ceramic capacitors having this type of inorganic substrate are typical examples encompassed by the "electronic component" defined in the present specification.

In an electronic component provided by the present invention, at least the part of the above-mentioned conductor film formed on the surface of the inorganic substrate on which the above-mentioned wire bonding sections are formed has the above-mentioned constitution (components), and therefore exhibits better wire bonding properties than a conventional conductor film. Therefore, such an electronic component exhibits satisfactory connection strength between a conductor film and an element (chip) of a semiconductor element and the like that is the object of the wire bonding (in particular, the strength of a connection part between a conductor film and a bonding wire), and therefore achieves wire bonding (connection).

In a preferred mode of the electronic component disclosed here, at least the part of the above-mentioned conductor film forming the above-mentioned wire bonding sections further contains an inorganic oxide and/or an oxide glass as an additive.

By using such a constitution, the sintering properties of the conductor film increase and the mechanical connection strength of a wire bonding section between a conductor film and a bonding wire (that is, the wire bonding properties) can be further improved. Moreover, a conductor film having such a constitution has excellent resistance to soldering heat, and when forming a conductor film other than at a wire bonding section, such as a conductor film for mounting a semiconductor chip, it is possible to effectively prevent the occurrence of soldering leaching when mounting (attaching) a semiconductor chip and the like on a substrate.

In particular, it is preferable for the present invention to contain an inorganic oxide as the above-mentioned additive, for the inorganic oxide to be a mixture of bismuth oxide and copper oxide and for the quantity of addition of the mixture to be a quantity corresponding to 0.5 to 5 parts by mass relative to 100 parts by mass of the above-mentioned Ag-based metal.

Alternatively, it is preferable for the present invention to contain an oxide glass as the above-mentioned additive and for the quantity of addition of the glass to be a quantity corresponding to 0.05 to 0.5 parts by mass relative to 100 parts by mass of the above-mentioned Ag-based metal.

In a preferred mode of the electronic component disclosed here, the above-mentioned inorganic substrate is a crystalline ceramic substrate comprising a crystalline ceramic and at least the part of the above-mentioned conductor film forming the above-mentioned wire bonding sections contains an inorganic oxide as the above-mentioned additive.

Alternatively, in a preferred mode of the electronic component disclosed here, the above-mentioned inorganic substrate is a non-crystalline ceramic substrate comprising a non-crystalline ceramic having a glass component as a main constituent and at least the part of the above-mentioned conductor film forming the above-mentioned wire bonding sections contains an oxide glass as the above-mentioned additive. Here, "main constituent" means a component whose quantity is greater than 50 mass % of the overall quantity, and typically means a component whose quantity is not less than 70 mass % of the overall quantity.

In a preferred mode of the electronic component disclosed here, the above-mentioned bonding wires are made from a metal having any of gold, aluminum and copper as a main constituent element.

A bonding wire constituted from such a metallic material can be preferably used to electrically and mechanically connect, for example, a semiconductor element and a conductor film.

In addition, the present invention provides a wire bonding section-forming conductor paste used to form a conductor film at least having wire bonding sections in an electronic component, which is provided with, as another aspect, an inorganic substrate, a conductor film formed on a surface of the substrate, and bonding wires bonded to a part of the conductor film and in which wire bonding sections are formed on at least a part of the electronic component. That is, the wire bonding section-forming conductor paste contains an Ag-based metal powder (fine metal particles) having an average particle diameter (typically determined on the basis of electron microscope observations or a light-scattering method) of 0.3 to 6.0 µm and formed of Ag or an alloy having Ag as a main constituent and an organic metal compound or a metal oxide, which coats the surface of the Ag-based metal powder and which has, as a constituent element, any of the elements selected from the group consisting of Al, Zr, Ti, Y, Ca, Mg, and Zn. In addition, the coating quantity of the above-mentioned organic metal compound or the above-mentioned metal oxide is a quantity corresponding to 0.02 to 0.1 parts by mass, in terms of metal oxide, relative to 100 parts by mass of the above-mentioned Ag-based metal powder.

In cases where a conductor film is formed on an inorganic substrate by using (coating) a conductor paste having such a constitution, it is possible to form a conductor film having better wire bonding properties than a case in which a conductor film is formed using a conventional Ag paste. Therefore, in cases where wire bonding is carried out between a semiconductor element and the like and a conductor film having excellent wire bonding properties formed from the above-mentioned conductor paste, the semiconductor element and the like and the conductor film can be electrically connected in a state whereby satisfactory connection strength (especially the strength of connection parts between the conductor film and the bonding wires) is ensured by the bonding wires.

In a preferred mode of the electronic component disclosed here, an organic oxide powder and/or an oxide glass powder are further contained as additives. In particular, a conductor paste which uses an Ag-based metal powder having an average particle diameter of 3.0 to 6.0 µm as the above-mentioned Ag-based metal powder and which contains an inorganic oxide powder and/or an oxide glass powder as an additive is preferred.

By using a conductor paste having such a constitution, it is possible to form a conductor film having further improved wire bonding properties. Moreover, a conductor film formed by using a conductor paste having such a constitution has excellent resistance to soldering heat, and when forming a conductor film other than at a wire bonding section, such as a conductor film for mounting a semiconductor chip, it is possible to effectively prevent the occurrence of soldering leaching when mounting (attaching) a semiconductor chip and the like on a substrate.

In particular, it is preferable for the present invention to contain an inorganic oxide powder as the above-mentioned additive, for the inorganic oxide powder to be a mixture of bismuth oxide and copper oxide and for the quantity of addition of the mixture is a quantity corresponding to 0.5 to 5 parts by mass relative to 100 parts by mass of the above-mentioned Ag-based metal powder.

Alternatively, it is preferable for the present invention to contain an oxide glass powder as the above-mentioned additive and for the quantity of addition of the glass powder to be a quantity corresponding to 0.05 to 0.5 parts by mass relative to 100 parts by mass of the above-mentioned Ag-based metal powder.

In addition, the present invention provides a method for producing an electronic component which is provided with, as another aspect, an inorganic substrate, a conductor film formed on a surface of said substrate, and bonding wires bonded to a part of said conductor film, and in which wire bonding sections are formed on at least a part of the electronic component. The method for producing an electronic component disclosed here comprises:

(1) preparing a wire bonding section-forming conductor paste having the following components: an Ag-based metal powder formed of Ag or an alloy having Ag as a main constituent and having an average particle diameter of 0.3 to 6.0 µm; and an organic metal compound or a metal oxide, which coats a surface of the above-mentioned Ag-based metal powder and which has, as a constituent element, any of the elements selected from the group consisting of Al, Zr, Ti, Y, Ca, Mg, and Zn, where, the coating quantity of the above-mentioned organic metal compound or the above-mentioned metal oxide is a quantity corresponding to 0.02 to 0.1 parts by mass, in terms of metal oxide, relative to 100 parts by mass of the above-mentioned Ag-based metal powder, (2) coating the above-mentioned conductor paste on a surface of the above-mentioned inorganic substrate so as to form a conductor film on the surface of the inorganic substrate, and (3) bonding the above-mentioned bonding wires to a part of the above-mentioned formed conductor film.

In the method for producing an electronic component of the present invention, the conductor film formed on a surface of the inorganic substrate is formed from a wire bonding section-forming conductor paste having the above-mentioned constitution, and therefore exhibits better wire bonding properties than conventional conductor films. Therefore, satisfactory connection strength is achieved at a bonding part between the conductor film and a bonding wire (that is, a wire bonding section). That is, by using this production method, it is possible to produce an electronic component which has good connectivity to a semiconductor element and the like and which has excellent electrical and mechanical characteristics.

In a preferred mode of the method for producing an electronic component disclosed here, the above-mentioned conductor paste further contains an organic oxide powder and/or an oxide glass powder as additives. In particular, a conductor paste which uses an Ag-based metal powder having an average particle diameter of 3.0 to 6.0 μm as the above-mentioned Ag-based metal powder and which contains an inorganic oxide powder and/or an oxide glass powder as an additive is preferred.

In particular, it is preferable for the present invention to contain an inorganic oxide powder as the above-mentioned additive, for the inorganic oxide powder to be a mixture of bismuth oxide and copper oxide and for the quantity of addition of the mixture to be a quantity corresponding to 0.5 to 5 parts by mass relative to 100 parts by mass of the above-mentioned Ag-based metal powder.

Alternatively, it is preferable for the present invention to contain an oxide glass powder as the above-mentioned additive and for the quantity of addition of the glass powder to be a quantity corresponding to 0.05 to 0.5 parts by mass relative to 100 parts by mass of the above-mentioned Ag-based metal powder.

In a preferred mode of the method for producing an electronic component disclosed here, the above-mentioned inorganic substrate is a crystalline ceramic substrate and the above-mentioned conductor paste contains an inorganic oxide powder as the above-mentioned additive.

Alternatively, in a preferred mode of the method for producing an electronic component disclosed here, the above-mentioned inorganic substrate is a non-crystalline ceramic substrate having a glass component as the main constituent and the above-mentioned conductor paste contains an oxide glass powder as the above-mentioned additive.

DESCRIPTION OF EMBODIMENTS

A preferred embodiment of the present invention will now be explained. Moreover, matters which are essential for carrying out the invention and which are matters other than those explicitly mentioned in the present specification are matters that a person skilled in the art could, on the basis of the prior art in this technical field, understand to be matters of design. The present invention can be carried out on the basis of the matters disclosed in the present specification and common technical knowledge in this technical field.

First, an explanation will be given of the materials that are preferably used in the method for producing an electronic component of the present invention.

The wire bonding section-forming conductor paste of the present invention (hereinafter referred to simply as "conductor paste") is a wire bonding section-forming conductor paste characterized by having an Ag-based metal powder as the main constituent, and the details or composition of other secondary components are not particularly limited as long as the above-mentioned objectives can be achieved.

The Ag-based metal powder is a group of fine particles substantially consisting of Ag or an alloy having Ag as the main constituent (for example, an Ag—Au alloy or an Ag—Pd alloy). From the perspective of imparting electrical conductivity, it is appropriate for this Ag-based metal powder to comprise elemental Ag or an alloy having a specific resistance of approximately 1.8 to $5.0 \times 10^{-6}$ Ω·cm (and preferably 1.9 to $3.0 \times 10^{-6}$ Ω·cm, for example $2.2 \times 10^{-6}$ Ωcm). In addition, the average particle diameter of the Ag-based metal powder is not particularly limited, but is preferably 0.3 to 6.0 μm. In addition, it is particularly preferable to use an Ag-based metal powder which has this type of relatively small average particle diameter and which has a relatively narrow particle size distribution, such as one in which particles having diameters of 10 μm or higher (and preferably 8 μm or higher) are substantially not contained.

Although not particularly limited, it is preferable to use (incorporate) an additive such as the inorganic oxide powder or glass powder mentioned below in the conductor paste when producing a conductor paste by using an Ag-based metal powder having an average particle diameter of not less than 3.0 μm (typically 3.0 to 6.0 μm) as the Ag-based metal powder.

Moreover, the Ag-based metal powder per se can be produced using a conventional publicly known method, and does not require a special production means. For example, it is possible to use an Ag-based metal powder produced using a well-known reduction precipitation method, gas phase reaction method or gas reduction method.

Next, an explanation will be given of the material that coats the surface of the Ag-based metal powder.

Organic metal compounds used to coat the Ag-based metal powder are not particularly limited as long as it is possible to ultimately (after firing) form a coating film (that is, a deposit that covers the surface) of a metal (including metal oxides or reduced products thereof) suitable for achieving the objectives of the present invention on the surface of the Ag-based metal powder. Preferred constituent metal elements include Al, Zr, Ti, Y, Ca, Mg, Zn and the like. Organic metal salts, metal alkoxides and chelate compounds having these metals as constituent elements can be preferably used.

For example, preferred metal alkoxides include zirconium alkoxides such as zirconium ethoxide or zirconium butoxide, aluminum alkoxides such as aluminum ethoxide ($Al(OC_2H_5)_3$), aluminum t-butoxide ($Al(OC(CH_3)_3)_3$), acetoalkoxy aluminum diisopropylate, acetoalkoxy aluminum ethylacetoacetate or acetoalkoxy aluminum acetylacetonate, titanium (IV) alkoxides such as tetrapropoxy titanium (Ti ($OC_3H_7)_4$), and a variety of polynuclear alcoholate complexes containing Zn, Mg, Ca and the like as a central metal atom (ion). In addition, examples of preferred chelate compounds include ethylene diamine (en) complexes and ethylene diamine tetraacetate (edta) complexes containing Zn, Mg, Ca and the like as a central metal atom (ion). Alternatively, a so-called chelating resin that forms a chelate with a metal (ion) such as Ti, Zn or Mg can also be preferably used as the organic metal compound (chelate compound) in the present invention.

In addition, other preferable examples of the organic metal compound used to coat the Ag based metal powder include organic acid metal salts having Al, Zr, Ti, Y, Ca, Mg, Zn and the like as a constituent metal element. In particular, organic acid metal salts having Al or Zr as the main constituent metal element are preferred. Particularly preferred organic acid metal salts are carboxylates having the above-mentioned elements as the main constituent metal element. For example, compounds of Al, Ca, Ti, Y or Zr and organic acids such as fatty acids (for example, naphthenic acid, octyl acid, ethyl hexanoic acid), abietic acid, naphthoic acid and the like can be preferably used. Particularly preferred organic acid metal salts are compounds of Al or Zr and carboxylic acids (in particular fatty acids).

When the Ag-based metal powder coated with this type of organic metal compound is subjected to heat treatment, a coating film of a metal oxide (alumina, zirconia and the like) that is an oxide of the organic metal compound is formed on the surface of the Ag-based metal powder particles. Alternatively, such a metal oxide can be generated by firing the coated Ag-based metal powder together with the inorganic substrate (for example, a crystalline or non-crystalline ceramic substrate). Therefore, it is not essential to subject the Ag-based metal powder (that is, the paste containing the powder) coated with an organic metal compound to heat treatment in advance before attaching to the inorganic substrate.

Alternatively, instead of an organic metal compound, a variety of oxide sols (typically an alumina sol, zirconia sol and the like) can be used as the coating material for the Ag-based metal powder of the present invention. In this case, the surface of the Ag-based metal powder is coated directly with a metal compound (oxide) such as zirconia or alumina.

Therefore, a conductor film formed from the Ag-based metal powder coated with an organic metal compound having the above-mentioned composition or an oxide of the metal has particularly high wire bonding properties, resistance to soldering heat and solder weatherability (soldering properties) after firing (after an oxide of the metal is produced in cases where an organic metal compound is coated). Therefore, when the Ag paste of the present invention is used, a conductor film (for example, a surface conductor film, side conductor film or internal conductor film) having wire bonding properties, resistance to soldering heat, bond strength and solder weatherability that are sufficient in practical use can be formed on an inorganic substrate (for example, a non-crystalline ceramic substrate) without using a large quantity of expensive precious metals such as palladium (Pd) and without performing a complicated plating treatment.

Next, an explanation will be given of preferred materials as secondary components able to be contained in the conductor paste (wire bonding section-forming conductor paste) of the present invention.

Examples of secondary components in the conductor paste of the present invention include organic media (vehicles) in which the above-mentioned metal powder is dispersed. When carrying out the present invention, such an organic vehicle can be any vehicle in which the metal powder can be dispersed, and any vehicle used for conventional conductor pastes can be used without any limitations. For example, organic solvents having high boiling points, for example cellulose polymers such as ethyl cellulose, ethylene glycol and diethylene glycol derivatives, toluene, xylene, mineral spirit, butyl carbitol, and terpineol can be used.

In addition, a variety of additives can be incorporated as secondary components in the conductor paste of the present invention as long as the inherent wire bonding properties, solder wettability, resistance to soldering heat and solder weatherability of the paste are not significantly impaired. For example, inorganic oxide powders, glass powders and the like can be used as such additives. It is particularly preferable to add small quantities of an inorganic oxide powder and/or a glass powder.

Specifically, an inorganic oxide powder can contribute to an improvement in the bond strength between the inorganic substrate (for example, a crystalline ceramic substrate) and the conductor film. Furthermore, an inorganic oxide powder prevents excessive shrinkage from occurring during firing of the conductor film formed from the conductor paste of the present invention, and can contribute to maintaining the precision or the mechanical strength of an electronic component to be produced at a high level in practical use. As this type of inorganic oxide, copper oxide, bismuth oxide, lead oxide, manganese oxide, cobalt oxide, magnesium oxide, tantalum oxide, niobium oxide, tungsten oxide and the like are particularly preferred. Of these, copper oxide and bismuth oxide are particularly preferred. In particular, bismuth oxide can facilitate sintering of the Ag-based metal powder and can reduce the viscosity of the conductor paste so as to improve the wettability with the inorganic substrate, and is therefore a particularly preferred inorganic oxide. In addition, copper oxide can improve adhesion to the inorganic substrate (substrate).

When adding these metal oxide powders as secondary components, a powder having an average particle diameter of 5 μm or less (typically 1 to 5 μm, and particularly preferably 1 μm or less) is preferred from the perspective of optimizing the filling ratio and the dispersibility of the paste. In addition, with regard to the specific surface area, a powder having a specific surface area of at least 0.5 $m^2/g$ is preferred, and a powder having a specific surface area of 1.0 $m^2/g$ or more is particularly preferred (typically 1.0 to 2.0 $m^2/g$, more preferably 2.0 to 100 $m^2/g$).

The glass powder can be an inorganic component (inorganic binding material) that contributes to stable firing and secure fixing (that is, an improvement in bond strength) of the paste component attached to the inorganic substrate (for example, a non-crystalline ceramic substrate). An oxide glass is particularly preferred. It is preferable for an oxide glass powder having a softening point of approximately 800° C. or less to be used from the perspective of the relationship with the firing temperature, which will be explained later. Examples of this type of glass powder include lead-based, zinc-based or borosilicate-based glass and glasses obtained by incorporating an alkaline earth metal oxide in these types of glass, typically glass powder selected from among lead-based glasses such as PbO—$SiO_2$—$B_2O_3$ glass and PbO—$SiO_2$—$B_2O_3$—$Al_2O_3$ glass, $SiO_2$—ZnO—RO glass (R denotes an alkaline earth metal), zinc-based glasses such as ZnO—$SiO_2$ glass and ZnO—$B_2O_3$—$SiO_2$ glass, and bismuth-based glasses such as $Bi_2O_3$—$SiO_2$ glass and $Bi_2O_3$—$B_2O_3$—$SiO_2$ glass. One or two or more types of these glasses may be used. In addition, it is preferable for the glass powder used to have a specific surface area of approximately 0.5 to 50 $m^2$/g and particularly preferable for the glass powder to have an average particle diameter of 2 μm or less (and especially approximately 1 μm or less).

In addition, a variety of organic additives can be incorporated as secondary components in the conductor paste of the present invention as long as the inherent wire bonding properties, solder wettability, resistance to soldering heat and solder weatherability of the paste are not significantly impaired. For example, such organic additives include a variety of organic binders, and a variety of silicon-based, titanate-based and aluminum-based coupling agents can be used in order to improve adhesion to the inorganic substrate (for example, a crystalline ceramic substrate).

Examples of organic binders include those based on acrylic resins, epoxy resins, phenol resins, alkyd resins, cellulose polymers, polyvinyl alcohol and the like. Those that can impart the conductor paste of the present invention with a good viscosity and an ability to form a coating film (an adhesion film to the inorganic substrate) are preferred. In addition, when it is desirable to impart photocuring properties (photosensitivity) to the conductor paste of the present invention, a variety of photopolymerizable compounds and photopolymerization initiators may be added as appropriate. In addition to the components mentioned above, a surfactant, an antifoaming agent, a plasticizer, a thickener, an antioxidant, a dispersing agent, a polymerization inhibitor and the like can be added as appropriate if necessary. These additives can be any additive able to be used to prepare a conventional conductor paste, and will not be described in detail.

An explanation will now be given of the substrate onto which the above-mentioned conductor paste is coated. Examples of inorganic substrates able to be used in the method for producing an electronic component disclosed here include crystalline ceramic substrates (hereinafter referred to as "ceramic substrates") and non-crystalline ceramic substrates having a glass component as the main constituent (hereinafter referred to as "glass ceramic substrates").

Examples of ceramic substrates include those constituted from ceramic materials such as alumina or zirconia and dielectric ceramic compositions represented by the general formula $xBaO \cdot yNd_2O_3 \cdot zTiO_2$ (6≤x≤23, 13≤y≤30, 64≤z≤68, x+y+z=100) which contain, relative to the main component, 01 to 3.0 mass % of copper oxide in terms of CuO, 0.1 to 4.0 mass % of zinc oxide in terms of ZnO and 0.1 to 3.0 mass % of boron oxide in terms of $B_2O_3$.

In addition, the glass ceramic substrate is a substrate formed by firing a green sheet that contains a glass component as the main constituent and a filler (a ceramic powder such as alumina). Typical examples of glass components include silicon oxide, strontium oxide, calcium oxide, aluminum oxide (alumina) and the like. One or two or more of these glass components may be used. In addition, the filler can be cordierite, mullite, steatite, forsterite and the like, which have dielectric constants of 30 or lower. Here, the mass ratio of the glass component and the filler is preferably between 60:40 and 80:20 (for example, 70:30). If the proportion of the glass component falls outside the above-mentioned range, it is difficult to form a composite oxide, and strength and sintering properties deteriorate.

A green sheet is typically formed by blending a glass component, a filler (for example, alumina) and a binder in an organic solvent so as to prepare a slurry-like dielectric paste and then forming a film of this dielectric paste on a support such as a polyethylene terephthalate (PET) sheet by a doctor blade method and the like. The binder can be a conventional publicly known binder, and is not particularly limited. For example, it is possible to use ethyl cellulose, polyvinyl butyral and the like. In addition, the organic solvent can be a conventional publicly known organic solvent, and is not particularly limited. For example, it is possible to use terpineol, butyl carbitol, acetone, toluene and the like.

The method for producing an electronic component of the present invention will now be explained.

First, an explanation will be given of a method for coating the organic metal compound or metal oxide on a surface of the Ag-based metal powder, that is, a method for producing a metal powder coated with a prescribed organic metal compound.

The metal powder used in the examples in the present invention is preferably one obtained by coating the surface of an Ag-based metal powder, which is the main constituent, almost uniformly with an organic metal compound or metal oxide, but the coating method is not particularly limited. For example, it is possible to use a conventional well-known method for coating an organic compound on metal particles without needing to modify the method. For example, a desired organic metal compound is first dissolved or dispersed in an appropriate organic solvent, such as toluene, xylene or an alcohol. Next, an Ag-based metal powder is added to the obtained solution or dispersion (sol) and dispersed/suspended therein. This suspension is left to stand or stirred for a prescribed period of time, thereby enabling the surface of the Ag-based metal powder in the suspension to be coated with the target organic metal compound. Here, although not particularly limited, the desired organic metal compound or metal oxide is coated on the Ag-based metal powder so that the coating quantity of the organic metal compound or metal oxide is preferably a quantity corresponding to 0.02 to 0.1 parts by mass (for example, 0.025 to 0.1 parts by mass) relative to 100 parts by mass of the Ag-based metal powder in terms of oxide. If this coating quantity is lower than a quantity corresponding to 0.02 parts by mass relative to 100 parts by mass of the Ag-based metal powder in terms of oxide, the coating effect is weak and it is difficult to achieve the above-mentioned objectives of the present invention. However, if this coating quantity significantly exceeds a quantity corresponding to 0.1 parts by mass relative to 100 parts by mass of the Ag-based metal powder in terms of oxide, various functions, such as the inherent electrical characteristics of the Ag-based metal powder, are lost, which is not desirable.

An explanation will now be given of the preparation of the conductor paste of the present invention. This conductor paste can be easily prepared by mixing an organic medium (vehicle) with the above-mentioned Ag-based metal powder (typically elemental Ag) that has been coated with an organic metal compound or metal oxide. Here, additives such as those mentioned above may be added/blended if necessary. For example, using a three-roll mill or another type of blender, the Ag-based metal powder and the various additives are directly blended with the organic vehicle at specific blending proportions and kneaded together.

Although not particularly limited, it is preferable to knead the various materials so that the Ag-based metal powder, which is coated with one or two or more types of organic metal compound or metal oxide, accounts for 60 to 95 mass %, and more preferably 70 to 90 mass %, of the overall paste.

The quantity of addition of the organic vehicle used to prepare the paste is preferably approximately 1 to 40 mass %, and especially 1 to 20 mass %, of the overall paste.

In addition, if the above-mentioned inorganic oxide powder is added as an additive, the usage quantity thereof is preferably 0.5 to 5 parts by mass relative to 100 parts by mass of the Ag-based metal powder. This usage quantity is more preferably approximately 0.5 to 3 parts by mass relative to 100 parts by mass of the Ag-based metal powder. This usage quantity is further preferably approximately 1 to 2 parts by mass relative to 100 parts by mass of the Ag-based metal powder. By using such a low addition quantity, it is possible to improve the bond strength to the inorganic substrate of a fired product (conductor film) obtained from the paste of the present invention and suppress shrinkage during firing of the fired product and also improve the wire bonding properties and resistance to soldering heat without substantially impairing the good electrical conductivity and solder wettability of the conductor paste of the present invention. Moreover, although not particularly limited, it is preferable to add an inorganic oxide powder to the conductor paste when using a ceramic substrate as the inorganic substrate.

Meanwhile, if the above-mentioned glass powder is added as an additive, the usage quantity thereof is preferably 0.05 to 0.5 parts by mass relative to 100 parts by mass of the Ag-based metal powder. This usage quantity is more preferably approximately 0.1 to 0.3 parts by mass relative to 100 parts by mass of the Ag-based metal powder. This usage quantity is further preferably approximately 0.1 to 0.2 parts by mass relative to 100 parts by mass of the Ag-based metal powder. By using such a low addition quantity, it is possible to improve the bond strength to the inorganic substrate of a fired product (conductor film) obtained from the paste of the present invention and also improve the wire bonding properties and resistance to soldering heat without substantially impairing the good electrical conductivity and solder wettability of the conductor paste of the present invention. Moreover, although not particularly limited, it is preferable to add a glass powder to the conductor paste when using a glass ceramic substrate (a green sheet) as the inorganic substrate.

Although not particularly limited, a conductor paste which uses a metal powder having an average particle diameter of 3.0 to 6.0 µm as the above-mentioned Ag-based metal powder and which contains an inorganic oxide powder and/or an oxide glass powder as an additive can be preferably used.

Next, the conductor paste (wire bonding section-forming conductor paste) prepared as described above is coated on the inorganic substrate, but this conductor paste can be handled in the same way as conventional conductor pastes that have come to be used to form conductor films such as wirings and electrodes on inorganic substrates, and it is possible to use a conventional publicly known method without any particular limitations. Typically, the conductor paste is coated on the inorganic substrate by a screen printing method or dispenser coating method so as to obtain the desired shape and thickness. Next, the coated paste is dried and then fired (baked) and hardened by being heated for a prescribed period of time in a heater under appropriate heating conditions (typically, the final firing temperature is approximately 500 to 960° C., and preferably within a temperature region that does not exceed the melting point of Ag, for example 700 to 960° C., and especially 800 to 900° C.). By carrying out this series of treatments, the target conductor film (wiring, electrode and the like) is formed.

Moreover, although not particularly limited, in cases where a ceramic substrate is used as the inorganic substrate, it is preferable to subject the ceramic substrate to firing treatment in advance, coat the conductor paste on the fired ceramic substrate, and then carry out a treatment that fires the conductor paste (after-firing). By doing so, the target conductor film is formed on the ceramic substrate.

Meanwhile, in cases where a glass ceramic substrate is used as the inorganic substrate, it is preferable to coat the conductor paste on a green sheet and then subject the green sheet and the conductor paste to firing treatment (simultaneous firing). By doing so, the target conductor film is formed on a glass ceramic substrate formed by firing the green sheet.

Next, a semiconductor chip and the like is mounted on the inorganic substrate (for example, by solder mounting using a reflow method). The mounted semiconductor chip (typically an aluminum electrode on a semiconductor chip (a bonding pad)) and the conductor film (typically wiring or an electrode) formed on the substrate are electrically and mechanically connected by means of bonding wires using a method similar to that used in the past (that is, wire bonding), thereby obtaining an electronic component (for example, a hybrid IC or a multichip module).

A conductor film formed from the conductor paste of the present invention can be directly connected to a semiconductor element and the like by means of bonding wires without surface of the conductor film being subjected to plating treatment, as was the case in the past. Furthermore, a connection part between the conductor film and a bonding wire (a wire bonding section) has satisfactory connection strength (wire bonding properties).

The bonding wires can be similar to those used for wire bonding in the past. For example, it is possible to use a wire made from a metal having any of gold, aluminum and copper as a main constituent element.

Moreover, a conductor film formed from the conductor paste of the present invention has excellent resistance to soldering heat and solder weatherability, and can therefore be preferably used in cases where a variety of semiconductor elements and the like are mounted on conductor films by means of soldering.

Figure 1:
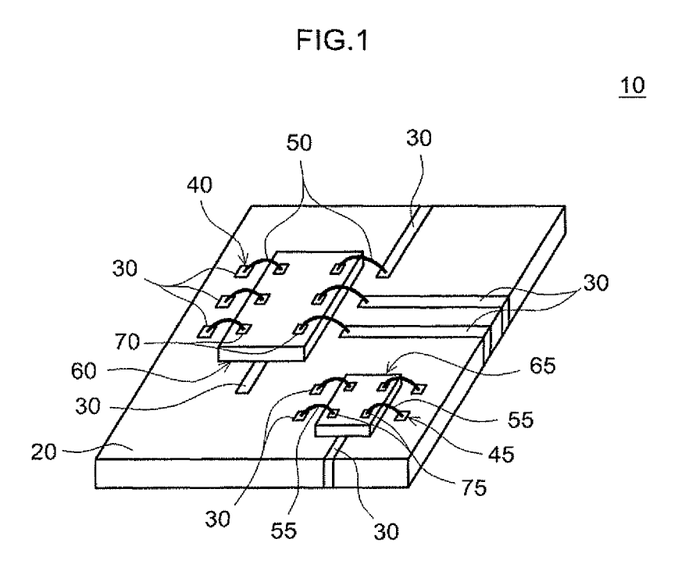
FIG. 1 is a perspective view showing a schematic representation of the external appearance of an electronic component according to one embodiment.

A preferred example of the electronic component of the present invention is shown in FIG. 1. FIG. 1 is a perspective view showing a schematic representation of the external appearance of an electronic component according to one embodiment. As shown in FIG. 1, an electronic component 10 according to the present embodiment is provided with a glass ceramic substrate (inorganic substrate) 20, a conductor film 30 formed on a surface of the substrate 20, and bonding wires 50 bonded to a part of the conductor film 30. More specifically, the glass ceramic substrate 20 is a multilayer glass ceramic substrate obtained by laminating a plurality of glass ceramic substrates on which are laminated conductor films (internal conductor films) comprising prescribed patterns. In addition, in order to connect a circuit in the vertical direction across the plurality of layers, it is necessary to form via hole conductor films (not shown).

The conductor film 30 having a prescribed pattern (typically wiring or an electrode) is formed on a surface of the ceramic substrate 20, and semiconductor elements 60 and 65 are solder mounted on a part of the conductor film 30 by means of a reflow method. In addition, a plurality of bonding pads (typically aluminum electrodes) 70 formed on semiconductor device 60 are connected mechanically and electrically to the conductor film 30 by means of bonding wires 50. In the same way, bonding pads 75 on the semiconductor device 65 are connected to the conductor film 30 by means of bonding wires 55. In the electronic component of the present invention, satisfactory mechanical connection strength (wire bonding properties) is achieved at the parts where between the conductor film 30 is connected to the bonding wires 50 and 55, that is, at the wire bonding sections 40 and 45.

Several working examples relating to the present invention will now be explained, but the present invention is in no way limited to these working examples.

Example 1

In the present example, an approximately spherical Ag powder having an average particle diameter of 0.7 μm prepared using an ordinary wet method was used as the base for a metal powder. Meanwhile, a zirconium alkoxide (zirconium butoxide in this case) was used as the material that coats the Ag powder. A coating solution having a concentration of 5 to 100 g/L was prepared by adding the above-mentioned metal alkoxide to an appropriate organic solvent (methanol in this case). Next, an appropriate quantity of the above-mentioned Ag powder was suspended in this solution, and the suspended state was maintained for 1 to 3 hours by stirring as appropriate. The Ag powder was then recovered and dried in an air flow at 60 to 110° C.

By carrying out the above-mentioned treatment, an Ag powder having the surface coated almost uniformly by the above-mentioned zirconium alkoxide at a quantity corresponding to 0.05 parts by mass, in terms of zirconium oxide ($ZrO_2$), relative to 100 parts by mass of the Ag powder was obtained (hereinafter referred to as the "Zr-coated Ag powder").

Next, a conductor paste was prepared using the Zr-coated Ag powder obtained as described above. That is, the materials used were weighed out so that the final concentrations (weight ratios) in the paste were 87 wt % of the Zr-coated Ag powder, with the remainder being a vehicle (terpineol and ethyl cellulose in this case), and blended using a three-roll mill. A conductor paste of Example 1 was prepared in this way.

Next, a conductor film was formed on a surface of a ceramic substrate (a ceramic (antenna module) substrate having a thickness of approximately 0.8 mm in this case) using the conductor paste of Example 1. That is, the above-mentioned ceramic substrate was subjected in advance to firing treatment for 1 hour at 900° C. in an electric furnace, and the conductor paste was coated on a surface of the above-mentioned fired ceramic substrate by means of an ordinary screen printing method so as to form a coating film having a prescribed thickness. The coating film was then subjected to drying treatment for 15 minutes at 100° C. by means of a dryer using far infrared radiation. By carrying out this drying treatment, the solvent evaporated from the above-mentioned coating film and an unfired conductor film was formed on the ceramic substrate.

Figure 2:
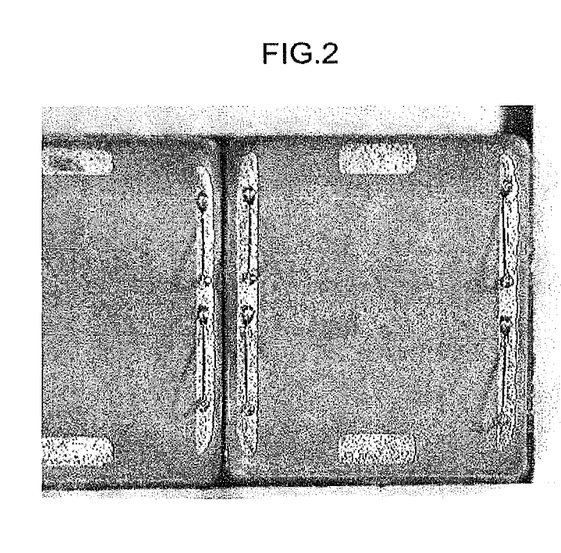
FIG. 2 is a photograph showing the structure of the surface of an electronic component according to one working example.

Next, this conductor film was fired (after-fired) with the ceramic substrate. That is, firing was carried out for 45 minutes in an electric furnace at 800° C. By carrying out this firing, a conductor film having a fired film thickness of 12 μm was baked on the ceramic substrate, as shown in FIG. 2. Hereinafter, "conductor film" means a conductor film following this firing.

Next, bonding wires were connected (bonded) to a part of the above-mentioned conductor film, as shown in FIG. 2, by means of a wire bonding device (HW27U-HF manufactured by Kyushu Matsushita Electrics). The wire bonding conditions were as follows.

<Wire Bonding Conditions>
Bonding wires: 99.99% Au, diameter 25 μm (GMH2 manufactured by Tanaka Denshi Kogyo)
Capillary: 1551-W3-BNIA (manufactured by Gaiser)
Ultrasonic wave output time (1st, 2nd): 25 ms, 30 ms
Ultrasonic wave output (1st, 2nd): 65 bit, 75 bit
Bonding load (1st, 2nd): 55 g, 70 g
Wire bonding temperature: 100° C.

By carrying out this wire bonding, an electronic component of Example 1, which was provided with bonding wires bonded to a part of the conductor film baked on the ceramic substrate, was prepared.

Example 2

An electronic component of Example 2 was prepared in the same way as Example 1, except that firing (after-firing) was carried out for 45 minutes in an electric furnace at 850° C.

Example 3

Firing (after-firing) was carried out for 45 minutes in an electric furnace at 900° C. so as to bake a conductor film having a fired film thickness of 12 μm on a ceramic substrate. Other than this, an electronic component of Example 3 was prepared in the same way as Example 1.

Example 4

An approximately spherical Ag powder having an average particle diameter of 2.0 μm was used. In addition, the same treatment as that in Example 1 was carried out, thereby obtaining an Ag powder having the surface coated almost uniformly by the above-mentioned zirconium alkoxide at a quantity corresponding to 0.1 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), bismuth oxide ($Bi_2O_3$) was added at a quantity corresponding to 0.5 parts by mass relative to 100 parts by mass of the Ag powder, copper oxide ($Cu_2O$) was added at a quantity corresponding to 0.5 parts by mass relative to 100 parts by mass of the Ag powder, and the mixture was blended using a three-roll mill. A conductor paste of Example 4 was prepared in this way.

The conductor paste of Example 4 was subjected to firing (after-firing) for 45 minutes in an electric furnace at 850° C. so as to bake a conductor film having a fired film thickness of 13 μm on a ceramic substrate. Other than this, an electronic component of Example 4 was prepared in the same way as Example 1.

Example 5

An approximately spherical Ag powder having an average particle diameter of 2.5 μm was used. In addition, the same treatment as that in Example 1 was carried out, thereby obtaining an Ag powder having the surface coated almost uniformly by the above-mentioned zirconium alkoxide at a quantity corresponding to 0.05 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), an oxide glass powder (a Si—Zn—RO glass containing $SiO_2$, ZnO, $B_2O_3$ and BaO) was added at a quantity corresponding to 0.1 parts by mass relative to 100 parts by mass of the Ag powder, and the mixture was blended using a three-roll mill. A conductor paste of Example 5 was prepared in this way.

Next, a conductor film was formed on a surface of a green sheet using the conductor paste of Example 5. That is, a coating film having a prescribed thickness was formed by coating a conductor paste on a surface of a green sheet using an ordinary screen printing method. The coating film was then subjected to drying treatment for 15 minutes at 100° C. by means of a dryer using far infrared radiation. The green sheet used in the present example was formed as follows. A glass having strontium oxide, calcium oxide, alumina and silicon oxide as the main constituents and, as a filler, an alumina ceramic powder were weighed out at a mass ratio of 70:30 and blended with ethyl cellulose and terpineol so as to prepare a slurry-like dielectric paste, and this paste was coated on PET at a thickness of 40 μm using a doctor blade method.

Next, this conductor film was fired with the green sheet (simultaneous firing). The firing was carried out for 1 hour in an electric furnace at 900° C. By carrying out this firing, the green sheet was sintered, thereby forming a glass ceramic substrate, and a conductor film was baked on the glass ceramic substrate. The fired film thickness was 13 μm. Next, an electronic component of Example 5 was prepared by wire bonding to a part of the conductor film formed on the glass ceramic substrate under the same conditions as those used in Example 1.

Example 6

An Ag powder having the surface coated almost uniformly by the above-mentioned zirconium alkoxide at a quantity corresponding to 0.025 parts by mass, in terms of $ZrO_2$, relative to 100 parts by mass of the Ag powder was used. Other than this, an electronic component of Example 6 was prepared in the same way as Example 5.

Example 7

An approximately spherical Ag powder having an average particle diameter of 0.4 μm was used. In addition, the same treatment as that in Example 1 was carried out, thereby obtaining an Ag powder having the surface coated almost uniformly by the above-mentioned zirconium alkoxide at a quantity corresponding to 0.1 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), an oxide glass powder (a Si—Zn—RO glass containing $SiO_2$, ZnO, $B_2O_3$ and BaO) was added at a quantity corresponding to 0.2 parts by mass relative to 100 parts by mass of the Ag powder, and the mixture was blended using a three-roll mill. A conductor paste of Example 7 was prepared in this way.

The conductor paste of Example 7 was subjected to firing (simultaneous firing) for 1 hour in an electric furnace at 850° C. so as to bake a conductor film having a fired film thickness of 15 μm on a glass ceramic substrate. Other than this, an electronic component of Example 7 was prepared in the same way as Example 3.

Example 8

A conductor paste of Example 8 was prepared in the same way as Example 7, except that an oxide glass powder was not added when the paste was prepared.

The conductor paste of Example 8 was subjected to firing (after-firing) for 45 minutes in an electric furnace at 850° C. so as to bake a conductor film having a fired film thickness of 15 μm on a ceramic substrate. Other than this, an electronic component of Example 8 was prepared in the same way as Example 1.

Example 9

A paste containing bismuth oxide ($Bi_2O_3$) and copper oxide ($Cu_2O$) as inorganic oxides was prepared. The bismuth oxide was used at a quantity corresponding to 0.5 parts by mass relative to 100 parts by mass of the Ag powder and the copper oxide was used at a quantity corresponding to 0.5 parts by mass relative to 100 parts by mass of the Ag powder. Other than this, a conductor paste of Example 9 was prepared in the same way as Example 8.

The conductor paste of Example 9 was used. Other than this, an electronic component of Example 9 was prepared in the same way as Example 8.

Example 10

An approximately spherical Ag powder having an average particle diameter of 3.5 μm was used. In addition, the same treatment as that in Example 1 was carried out, thereby obtaining an Ag powder having the surface coated almost uniformly by the above-mentioned zirconium alkoxide at a quantity corresponding to 0.1 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), and blended using a three-roll mill. A conductor paste of Example 10 was prepared in this way.

Next, using the conductor paste of Example 10 and the same ceramic substrate as that used in Example 1, a conductor film was formed on a surface of the ceramic substrate. That is, a coating film having a prescribed thickness was formed by coating a conductor paste on a surface of a ceramic substrate using an ordinary screen printing method. The coating film was then subjected to drying treatment for 15 minutes at 100° C. by means of a dryer using far infrared radiation.

Next, this conductor film was fired with the ceramic substrate (simultaneous firing). The firing was carried out for 1 hour in an electric furnace at 850° C. to 900° C. By carrying out this firing, a conductor film having a fired film thickness of 14 μm was baked on the ceramic substrate. Other than this, an electronic component of Example 10 was prepared in the same way as Example 1.

Example 11

A paste containing bismuth oxide ($Bi_2O_3$) and copper oxide ($Cu_2O$) as inorganic oxides was prepared. The bismuth oxide was used (added) at a quantity corresponding to 0.5 parts by mass relative to 100 parts by mass of the Ag powder and the copper oxide was used (added) at a quantity corresponding to 0.5 parts by mass relative to 100 parts by mass of the Ag powder. Other than this, an electronic component of Example 11 was prepared in the same way as Example 10.

Example 12

An approximately spherical Ag powder having an average particle diameter of 6.0 μm was used. In addition, the same treatment as that in Example 1 was carried out, thereby obtaining an Ag powder having the surface coated almost uniformly by the above-mentioned zirconium alkoxide at a quantity corresponding to 0.05 parts by mass, in terms of $ZrO_2$, relative to 100 parts by mass of the Ag powder. Other than this, a conductor paste of Example 12 was prepared in the same way as Example 11.

The conductor paste of Example 12 was subjected to firing (simultaneous firing) for 1 hour in an electric furnace at 900° C. so as to bake a conductor film having a fired film thickness of 13 μm on a ceramic substrate. Other than this, an electronic component of Example 12 was prepared in the same way as Example 11.

Example 13

In the present example, an approximately spherical Ag powder having an average particle diameter of 2.0 μm was used as the base for a metal powder. Coating with an organic metal compound was not carried out. That is, using this non-coated Ag powder, these materials were weighed out so that the final concentrations (weight ratios) in the paste were 87 wt % of the Ag powder, with the remainder being a vehicle (terpineol and ethyl cellulose in this case), and blended using a three-roll mill. A conductor paste of Example 13 was prepared in this way.

Next, using the conductor paste of Example 13 and the green sheet of Example 5, a conductor film was formed on a surface of the green sheet (glass ceramic substrate). That is, the above-mentioned green sheet was subjected in advance to firing treatment for 1 hour at 900° C. in an electric furnace, and the conductor paste was coated on a surface of the glass ceramic substrate, which was formed by the green sheet being sintered by the above-mentioned firing, by means of an ordinary screen printing method so as to form a coating film having a prescribed thickness.

Next, this conductor film was fired (after-baked) with the glass ceramic substrate. That is, firing was carried out for 45 minutes in an electric furnace at 850° C. By carrying out this firing, a conductor film having a fired film thickness of 12 μm was baked on the glass ceramic substrate. Other than this, an electronic component of Example 13 was prepared in the same way as Example 1.

Example 14

A conductor film was baked on a glass ceramic substrate in the same way as Example 13 Next, the surface of the conductor film was subjected to electroless Ni/Au plating (plating thickness 0.5 μm). Next, an electronic component of Example 14 was prepared by wire connecting bonding wires to the plated part of the conductor film under the same conditions as those used in Example 1.

Example 15

A paste containing a Si—Zn—RO glass, which contains $SiO_2$, ZnO, $B_2O_3$ and BaO, as an oxide glass powder was prepared. The above-mentioned oxide glass powder was used (added) at a quantity corresponding to 2.0 parts by mass relative to 100 parts by mass of the Ag powder. Other than this, a conductor paste of Example 15 was prepared in the same way as Example 13.

Using the conductor paste of Example 15, a conductor film having a fired film thickness of 11 μm was baked on the glass ceramic substrate. Other than this, an electronic component of Example 15 was prepared in the same way as Example 13.

Example 16

An approximately spherical Ag powder having an average particle diameter of 0.2 μm was used. In addition, the same treatment as that in Example 1 was carried out, thereby obtaining an Ag powder having the surface coated almost uniformly by the above-mentioned zirconium alkoxide at a quantity corresponding to 0.1 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), and blended using a three-roll mill. A conductor paste of Example 16 was prepared in this way.

The conductor paste of Example 16 was subjected to firing (after-firing) for 45 minutes in an electric furnace at 850° C. to 900° C. so as to bake a conductor film having a fired film thickness of 14 μm on a ceramic substrate. Other than this, an electronic component of Example 16 was prepared in the same way as Example 13.

Example 17

An approximately spherical Ag powder having an average particle diameter of 0.4 μm was used. In addition, the same treatment as that in Example 1 was carried out, thereby obtaining an Ag powder having the surface coated almost uniformly by the above-mentioned zirconium alkoxide at a quantity corresponding to 0.01 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose in this case), and blended using a three-roll mill. A conductor paste of Example 17 was prepared in this way.

The conductor paste of Example 17 was subjected to firing (simultaneous baking) for 1 hour in an electric furnace at 850° C. to 900° C. so as to bake a conductor film having a fired film thickness of 14 μm on a glass ceramic substrate. Other than this, an electronic component of Example 17 was prepared in the same way as Example 5.

Example 18

An Ag powder having the surface coated almost uniformly by the above-mentioned zirconium alkoxide at a quantity corresponding to 0.25 parts by mass, in terms of $ZrO_2$, relative to 100 parts by mass of the Ag powder was obtained. Other than this, an electronic component of Example 18 was prepared in the same way as Example 17.

Example 19

An approximately spherical Ag powder having an average particle diameter of 8.0 μm was used. In addition, the same treatment as that in Example 1 was carried out, thereby obtaining an Ag powder having the surface coated almost uniformly by the above-mentioned zirconium alkoxide at a quantity corresponding to 0.05 parts by mass, in terms of $ZrO_2$, relative to 100 parts by mass of the Ag powder.

The materials used were weighed out so that the final concentrations (weight ratios) in the paste were 87 wt % of the Zr-coated Ag powder, with the remainder being a vehicle (terpineol and ethyl cellulose), bismuth oxide ($Bi_2O_3$) was added at a quantity corresponding to 0.5 parts by mass relative to 100 parts by mass of the Ag powder, copper oxide ($Cu_2O$) was added at a quantity corresponding to 0.5 parts by mass relative to 100 parts by mass of the Ag powder, and the mixture was blended using a three-roll mill. A conductor paste of Example 19 was prepared in this way.

The conductor paste of Example 19 was subjected to firing (simultaneous firing) for 1 hour in an electric furnace at 900° C. so as to bake a conductor film having a fired film thickness of 13 μm on a glass ceramic substrate. Other than this, an electronic component of Example 19 was prepared in the same way as Example 5.

Moreover, the average particle diameters of the Ag powders, the coating quantities of the organic metal compounds (zirconium alkoxides), the types and added quantities of the additives, the presence or absence of Ni/Au plating, the fired film thicknesses, the firing temperatures, the inorganic substrates and the firing methods in the above-mentioned examples are shown in Tables 1 to 5 below.

TABLE 1

|  | Example 1 | Example 2 | Example 3 | Example 4 |
|---|---|---|---|---|
| Average Particle diameter of Ag powder (μm) | 0.7 | 0.7 | 0.7 | 2.0 |
| Coating quantity (parts by mass) | 0.05 ($ZrO_2$) | 0.05 ($ZrO_2$) | 0.05 ($ZrO_2$) | 0.1 ($ZrO_2$) |
| Additive | — | — | — | $Bi_2O_3 + Cu_2O$ |
| Quantity of addition (parts by mass) | — | — | — | 0.5 + 0.5 |
| Ni/Au plating (μm) | — | — | — | — |
| Fired film thickness (μm) | 13 | 13 | 12 | 13 |
| Firing temperature (° C.) | 800 | 850 | 900 | 850 |
| Wire bonding properties | ⊗ | ⊗ | ⊗ | ⊗ |
| Initial tensile strength (g) | 6.2 | 6.7 | 6.4 | 7.4 |
| Tensile strength following PCT (g) | 8.1 | 8.2 | 7.9 | 7.1 |
| Resistance to soldering heat | ○ | ○ | ○ | ⊗ |
| Solder weatherability | ⊗ | ⊗ | ⊗ | ⊗ |
| Inorganic substrate | Ceramic | Ceramic | Ceramic | Ceramic |
| Firing method | After-firing | After-firing | After-firing | After-firing |

TABLE 2

|  | Example 5 | Example 6 | Example 7 | Example 8 |
|---|---|---|---|---|
| Average Particle diameter of Ag powder (μm) | 2.5 | 2.5 | 0.4 | 0.4 |
| Coating quantity (parts by mass) | 0.05 ($ZrO_2$) | 0.025 ($ZrO_2$) | 0.1 ($ZrO_2$) | 0.1 ($ZrO_2$) |
| Additive | Si—Zn—RO glass | Si—Zn—RO glass | Si—Zn—RO glass | — |
| Quantity of addition (parts by mass) | 0.1 | 0.1 | 0.2 | — |
| Ni/Au plating (μm) | — | — | — | — |
| Fired film thickness (μm) | 13 | 13 | 15 | 15 |
| Firing temperature (° C.) | 900 | 900 | 850 | 850 |
| Wire bonding properties | ⊗ | ⊗ | ⊗ | ⊗ |
| Initial tensile strength (g) | 8.2 | 8.1 | 7.8 | 7.4 |
| Tensile strength following PCT (g) | 7.9 | 7.8 | 7.4 | 7.3 |
| Resistance to soldering heat | ⊗ | ⊗ | ⊗ | ○ |
| Solder weatherability | ⊗ | ⊗ | ⊗ | ⊗ |
| Inorganic substrate | Glass ceramic | Glass ceramic | Glass ceramic | Ceramic |
| Firing method | Simultaneous firing | Simultaneous firing | Simultaneous firing | After-firing |

TABLE 3

|  | Example 9 | Example 10 | Example 11 | Example 12 |
|---|---|---|---|---|
| Average Particle diameter of Ag powder (μm) | 0.4 | 3.5 | 3.5 | 6.0 |
| Coating quantity (parts by mass) | 0.1 ($ZrO_2$) | 0.1 ($ZrO_2$) | 0.1 ($ZrO_2$) | 0.05 ($ZrO_2$) |
| Additive | $Bi_2O_3 + Cu_2O$ | — | $Bi_2O_3 + Cu_2O$ | $Bi_2O_3 + Cu_2O$ |
| Quantity of addition (parts by mass) | 0.5 + 0.5 | — | 0.5 + 0.5 | 0.5 + 0.5 |
| Ni/Au plating (μm) | — | — | — | — |
| Fired film thickness (μm) | 15 | 14 | 14 | 13 |
| Firing temperature (° C.) | 850 | 850 to 900 | 850 to 900 | 900 |
| Wire bonding properties | ⊗ | ⊗ | ⊗ | ⊗ |
| Initial tensile strength (g) | 7.7 | 7.1 | 8.1 | 7.5 |
| Tensile strength following PCT (g) | 7.5 | 7.0 | 7.8 | 7.4 |

TABLE 3-continued

|  | Example 9 | Example 10 | Example 11 | Example 12 |
|---|---|---|---|---|
| Resistance to soldering heat | ⊗ | ○ | ⊗ | ⊗ |
| Solder weatherability | ⊗ | ⊗ | ⊗ | ⊗ |
| Inorganic substrate | Ceramic | Ceramic | Ceramic | Ceramic |
| Firing method | After-firing | Simultaneous firing | Simultaneous firing | Simultaneous firing |

TABLE 4

|  | Example 13 | Example 14 | Example 15 | Example 16 |
|---|---|---|---|---|
| Average Particle diameter of Ag powder (μm) | 2.0 | 2.0 | 2.0 | 0.2 |
| Coating quantity (parts by mass) | — | — | — | 0.1 (ZrO$_2$) |
| Additive | — | — | Si—Zn—RO glass | — |
| Quantity of addition (parts by mass) | — | — | 2.0 | — |
| Ni/Au plating (μm) | — | 0.5 | — | — |
| Fired film thickness (μm) | 12 | 12 | 11 | 14 |
| Firing temperature (° C.) | 850 | 850 | 850 | 850 to 900 |
| Wire bonding properties | X | ○ | X | X |
| Initial tensile strength (g) | 4.5 | 8.4 | X | 3.1 |
| Tensile strength following PCT (g) | 1.9 | 4.1 | X | 1.1 |
| Resistance to soldering heat | X | ⊗ | X | X |
| Solder weatherability | X | ○ | X | ○ |
| Inorganic substrate | Glass ceramic | Glass ceramic | Glass ceramic | Glass ceramic |
| Firing method | After-firing | After-firing | After-firing | After-firing |

TABLE 5

|  | Example 17 | Example 18 | Example 19 |
|---|---|---|---|
| Average Particle diameter of Ag powder (μm) | 0.4 | 0.4 | 8.0 |
| Coating quantity (parts by mass) | 0.01 (ZrO$_2$) | 0.25 (ZrO$_2$) | 0.05 (ZrO$_2$) |
| Additive | — | — | Bi$_2$O$_3$ + Cu$_2$O |
| Quantity of addition (parts by mass) | — | — | 0.5 + 0.5 |
| Ni/Au plating (μm) | — | — | — |
| Fired film thickness (μm) | 14 | 14 | 13 |
| Firing temperature (° C.) | 850 to 900 | 850 to 900 | 900 |
| Wire bonding properties | X | X | X |
| Initial tensile strength (g) | 3.4 | 3.9 | 5.9 |
| Tensile strength following PCT (g) | 1.5 | 1.7 | 3.5 |
| Resistance to soldering heat | X | X | ○ |
| Solder weatherability | ○ | ○ | X |
| Inorganic substrate | Glass ceramic | Glass ceramic | Glass ceramic |
| Firing method | Simultaneous firing | Simultaneous firing | Simultaneous firing |

Next, in order to evaluate the characteristics of the electronic components obtained in the examples, the wire bonding properties (that is, the initial tensile strength and the tensile strength following a pressure cooker test (PCT)), the resistance to soldering heat and the solder weatherability (soldering properties) were tested/measured as follows. The results of these property evaluation tests are shown for each electronic component in the corresponding columns in Tables 1 to 5.

[Evaluation of Wire Bonding Properties]

The wire bonding properties of the electronic components obtained in the above-mentioned examples were evaluated.

(1) Initial Tensile Strength Measurement Test

Figure 3:
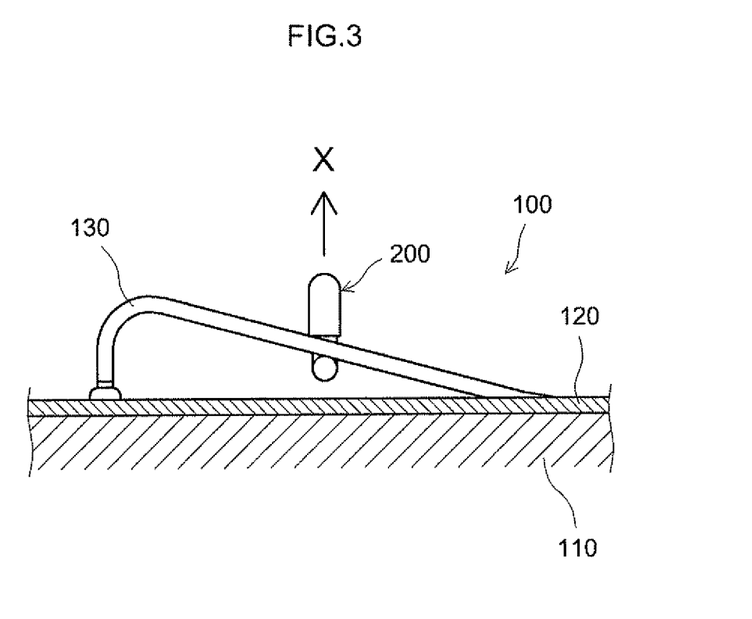
FIG. 3 is an explanatory diagram showing a test method of a wire bonding properties evaluation test.

As shown in FIG. 3, for each of the electronic components 100 obtained in the above-mentioned examples, a bonding wire 130 connected to a conductor film 120 on an inorganic substrate (ceramic substrate or glass ceramic substrate) 110 was pulled vertically upwards in the direction of the arrow X at a rate of 0.5 mm/sec on a bonding tester 200 (PTR-1000 manufactured by Rhesca), and the initial tensile strength (g) at the point where the bonding wire broke was measured. Here, the initial tensile strength means the tensile strength of the bonding wire immediately after connecting the bonding wire to the conductor film.

(2) Tensile Strength Measurement Test Following PCT

Each of the electronic components obtained in the above-mentioned examples was subjected to a pressure cooker test (PCT) for 60 hours at a temperature of 121° C., a relative humidity of 98% and a pressure of 2 atm. The tensile strength (g) following the PCT of the bonding wires of each of the electronic components obtained in the above-mentioned examples was measured under the same conditions as those used in the measurement test in (1) above.

If the initial tensile strength and the tensile strength following the PCT were both 6 (g) or higher, the bonding wire in question was judged to exhibit excellent wire bonding properties and marked with ⊗ in the table. If either the initial tensile strength or the tensile strength following the PCT was 6 (g) or higher, the bonding wire in question was judged to exhibit wire bonding properties and marked with O in the table. However, if the initial tensile strength and the tensile strength following the PCT were both less than 6 (g), the bonding wire in question was judged to exhibit poor wire bonding properties and marked with x in the table.

[Resistance to Soldering Heat Evaluation Test]

Each of the conductor pastes obtained in Examples 1 to 19 above was coated at a thickness of 0.2 mm on a surface of a rectangular test piece (measuring 45 mm×32 mm×0.8 mm) comprising an inorganic substrate obtained in the example in question and fired under the same conditions as those used when producing the electronic component obtained in the example in question, thereby baking a conductor film on the test piece. Next, a rosin flux was coated on the conductor film part of the test piece and the test piece was then immersed for 10 seconds in molten solder (Sn/Pb weight ratio=60/40) at a temperature of 260° C.

Figure 4:
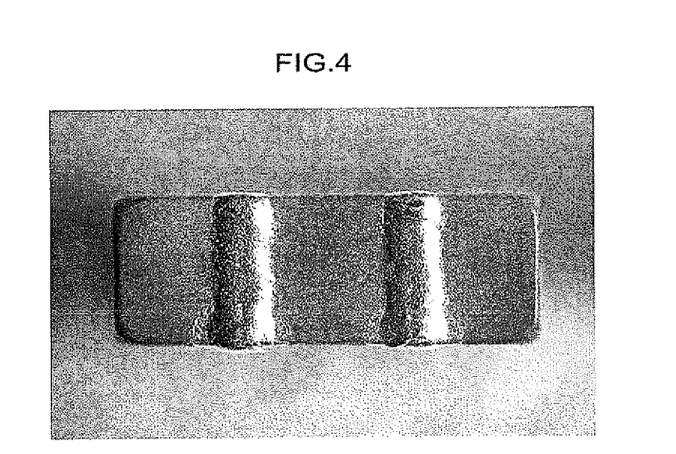
FIG. 4 is a photograph showing the condition of the surface of the test piece in Example 4 after the test piece was immersed in molten solder.
Figure 5:
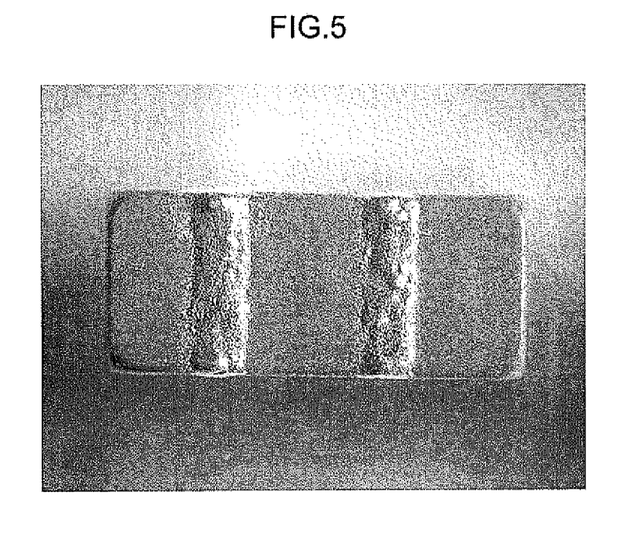
FIG. 5 is a photograph showing the condition of the surface of the test piece in Example 1 after the test piece was immersed in molten solder.
Figure 6:
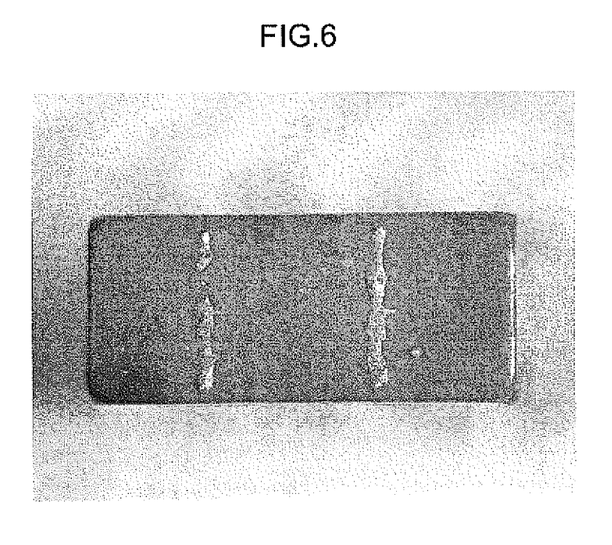
FIG. 6 is a photograph showing the condition of the surface of the test piece in Example 13 after the test piece was immersed in molten solder.

Following the immersion, the resistance to soldering heat was evaluated in terms of the areal ratio of the portion in which "soldering leaching" did not occur, that is, the conductor film that remained on the substrate (base) after immersion compared to before immersion. FIG. 4 to FIG. 6 are photographs showing the state of the conductor films of Example 4, Example 1 and Example 13 respectively following the above-mentioned resistance to soldering heat evaluation test (photographs of the other examples are not shown). Those test pieces that did not suffer from soldering leaching (that is, those in which the conductor film did not dissolve in the solder) were judged to exhibit excellent resistance to soldering heat and marked with ⊗ in the table. In addition, those test pieces which did suffer from soldering leaching but in which approximately 90% or more of the conductor film remained were judged to exhibit good resistance to soldering heat and marked with O in the table. However, those test pieces in which less than 90% of the conductor film prior to immersion remained were judged to exhibit poor resistance to soldering heat and marked with x in the table. Moreover, of the test pieces obtained in the other examples, those similar to that in FIG. 4 were marked with ⊗, those similar to that in FIG. 5 were marked with O, and those similar to FIG. 6 were marked with x.

[Solder Weatherability Evaluation Test]

Each of the conductor pastes obtained in Examples 1 to 19 above was coated at a width of 0.2 mm on a surface of a rectangular test piece (measuring 45 mm×32 mm×0.8 mm) comprising an inorganic substrate obtained in the example in question and fired under the same conditions as those used when producing the electronic component obtained in the example in question, thereby baking a conductor film on the test piece. Each of the test pieces of the above-mentioned examples was subjected to a pressure cooker test (PCT) for 60 hours at a temperature of 121° C., a relative humidity of 98% and a pressure of 2 atm. Each of the conductor films formed on the test pieces was immersed in a 25% rosin flux so as to coat the rosin flux on the part on which the conductor film was formed, and the test piece was then immersed in a eutectic solder (Sn/Pb weight ratio=60/40). Here, the solder temperature was 235±5° C. and the immersion time was 2±0.5 seconds.

The solder weatherability was evaluated in terms of the areal ratio of the solder covering the surface of the conductor film following immersion. Those test pieces in which solder did not detach were judged to exhibit excellent solder weatherability and marked with 0 in the table. In addition, those test pieces in which solder did detach partially but in which approximately 95% or more of the test piece was covered by solder were judged to exhibit good solder weatherability and marked with 0 in the table. However, those test pieces in which less than 90% of the test piece was covered by solder were judged to exhibit poor solder weatherability and marked with x in the table.

As is clear from the wire bonding properties evaluation test, it was confirmed that a conductor film formed from the conductor paste of the present invention, that is, a paste that contains an Ag-based metal powder having an average particle diameter of 0.3 to 6.0 μm and a zirconium alkoxide at a quantity corresponding to 0.02 to 0.1 parts by mass in terms of Zr oxide relative to 100 parts by mass of the Ag-based metal powder, exhibits excellent initial tensile strength and tensile strength following a PCT and exhibits excellent wire bonding properties (Example 1 to Example 12). In addition, it was confirmed from the results obtained from those examples in which additives were added that adding an appropriate quantity of an oxide glass powder or an inorganic oxide powder to the conductor paste improves the wire bonding properties (for example, Example 10 and Example 11, Example 8 and Example 7, and Example 9). Moreover, it was confirmed that in the electronic component of Example 14, plating the conductor film (wire bonding section) gave excellent initial tensile strength, but the tensile strength following a PCT was poor.

In addition, as is clear from the resistance to soldering heat evaluation test, it was confirmed that a conductor film formed from the wire bonding section-forming conductor paste of the present invention exhibited good resistance to soldering heat as another characteristic (Example 1 to Example 12). It was confirmed that those examples in which additives were added in particular exhibited excellent resistance to soldering heat (Examples 4 to 7, Example 9, Example 11 and Example 12). Therefore, when mounting a semiconductor element and the like on a conductor film formed using the above-mentioned conductor paste, it is possible to solder mount the semiconductor element and the like on the conductor film without subjecting the surface of the conductor film to plating treatment.

In addition, as is clear from the solder weatherability evaluation test, it was confirmed that a conductor film formed from the wire bonding section-forming conductor paste of the present invention exhibited good solder weatherability as another characteristic (Example 1 to Example 12). Therefore, it is thought that an electronic component obtained by directly solder mounting a semiconductor element and the like on a conductor film formed using the above-mentioned conductor paste has the property of the semiconductor element and the like hardly detaching from the conductor film even when the electronic component is used for a long period of time.

Therefore, by forming a conductor film on a substrate by using the conductor film-forming material (conductor paste) of the present invention, it is possible to mount an electronic component by means of soldering and an electronic component by means of wire bonding on a substrate (inorganic substrate) of an electronic component by using the same conductor film-forming material (composition).

INDUSTRIAL APPLICABILITY

According to the conductor paste invention, it is possible to form a conductor film having excellent wire bonding properties, resistance to soldering heat and solder weatherability. Therefore, the present invention can provide an electronic component in which a semiconductor element and the like and a conductor film are connected in a state whereby satisfactory connection strength can be ensured by bonding wires and which can withstand use over a long period of time. Furthermore, the conductor paste of the present invention can be used in cases where an electronic component such as a semiconductor element is soldered to a substrate and in cases where such an electronic component is mounted by means of wire bonding, and therefore contributes to a reduction in the number of production processes.

REFERENCE SINGS LIST

10 Electronic component
20 Glass ceramic substrate (inorganic substrate)
30 Conductor film
40, 45 Wire bonding sections
50, 55 Bonding wires
60, 65 Semiconductor elements
70, 75 Bonding pads
100 Electronic component 110 Inorganic substrate
120 Conductor film
130 Bonding wire
200 Bonding tester

The invention claimed is:

1. An electronic component comprising:
an inorganic substrate;
a wet plating-less conductor film formed on a surface of said substrate, at least a part of the conductor film having wire bonding sections; and
bonding wires directly bonded to the wire bonding sections within at least a part of the conductor film;
wherein:
the wire bonding sections contain:
an Ag-based metal formed of Ag or an alloy having Ag as a main constituent; and
a metal oxide coating said Ag-based metal and having, as a constituent element, any of the elements selected from the group consisting of Al, Zr, Ti, Y, Ca, Mg, and Zn; and
the metal oxide that coats the Ag-based metal is present in an amount in a range of from 0.02 to 0.1 parts by mass relative to 100 parts by mass of the Ag-based metal.

2. The electronic component according to claim 1, wherein the wire bonding sections within at least a part of the conductor film further contains an inorganic oxide and/or an oxide glass as an additive.

3. The electronic component according to claim 2, wherein:
the inorganic substrate is a crystalline ceramic substrate, and
the wire bonding sections within at least a part of the conductor film contain an inorganic oxide as the additive.

4. The electronic component according to claim 2, wherein:
the inorganic substrate is a non-crystalline ceramic substrate having a glass component as a main constituent, and
the wire bonding sections within at least a part of the conductor film contain an oxide glass as the additive.

5. The electronic component according to claim 3, wherein the inorganic oxide is a mixture of bismuth oxide and copper oxide, and said mixture is present in an amount in a range of from 0.5 to 5 parts by mass relative to 100 parts by mass of the Ag-based metal.

6. The electronic component according to claim 4, wherein the oxide glass is present in an amount in a range of from 0.05 to 0.5 parts by mass relative to 100 parts by mass of the Ag-based metal.

7. The electronic component according to claim 1, wherein the bonding wires are made from a metal having any metallic element selected from the group consisting of gold, aluminum, and copper as a main constituent element.

8. A wire bonding section-forming conductor paste comprising:
an Ag-based metal powder having an average particle diameter of 0.3 to 6.0 μm and formed of Ag or an alloy having Ag as a main constituent; and
an organic metal compound or a metal oxide coating a surface of said Ag-based metal powder and having, as a constituent element, any of the elements selected from the group consisting of Al, Zr, Ti, Y, Ca, Mg, and Zn,
wherein:
the wire bonding section-forming conductor paste is configured to form a conductor film on a surface of an inorganic substrate in which at least a part of the conductor film contains wire bonding sections to which bonding wires are directly bonded for an electronic component; and
the organic metal compound or the metal oxide that coats the Ag-based metal is present in an amount in a range of from 0.02 to 0.1 parts by mass, in terms of metal oxide, relative to 100 parts by mass of the Ag-based metal powder.

9. The conductor paste according to claim 8, further containing an inorganic oxide powder and/or an oxide glass powder as an additive.

10. The conductor paste according to claim 9, further containing an inorganic oxide powder and/or an oxide glass powder as an additive when an average particle diameter of the Ag-based metal powder is a diameter in a range of from 3.0 to 6.0 μm.

11. The conductor paste according to claim 9, wherein:
the inorganic oxide powder is a mixture of bismuth oxide and copper oxide, and
said mixture is present in an amount in a range of from 0.5 to 5 parts by mass relative to 100 parts by mass of the Ag-based metal powder.

12. The conductor paste according to claim 9, wherein the oxide glass powder is present in an amount in a range of from 0.05 to 0.5 parts by mass relative to 100 parts by mass of the Ag-based metal powder.

13. A method for producing an electronic component that comprises an inorganic substrate, a wet plating-less conductor film formed on a surface of said substrate, and bonding wires, the method comprising:
(1) preparing a wire bonding section-forming conductor paste comprising:
an Ag-based metal powder formed of Ag or an alloy having Ag as a main constituent and having an average particle diameter of 0.3 to 6.0 μm; and
an organic metal compound or a metal oxide coating a surface of the Ag-based metal powder and having, as a constituent element, any of the elements selected from the group consisting of Al, Zr, Ti, Y, Ca, Mg, and Zn; and
(2) coating the conductor paste on the surface of the inorganic substrate to form a conductor film on the surface of said inorganic substrate, at least a part of the formed conductor film containing wire bonding sections; and
(3) bonding the bonding wires directly to the wire bonding sections within at least a part of the formed conductor film;
wherein:
the organic metal compound or the metal oxide that coats the Ag-based metal powder is present in an amount in a range of from 0.02 to 0.1 parts by mass, in terms of metal oxide, relative to 100 parts by mass of the Ag-based metal powder; and
a surface of the conductor film is not subjected to wet plating.

14. The method according to claim 13, wherein the conductor paste further contains an inorganic oxide powder and/or an oxide glass powder as an additive.

15. The method according to claim 14, wherein the conductor paste further contains an inorganic oxide powder and/or an oxide glass powder as an additive when the average particle diameter of the Ag-based metal powder is a diameter in a range of from 3.0 to 6.0 μm.

16. The method according to claim 15, wherein the inorganic substrate is a crystalline ceramic substrate and the conductor paste further contains an inorganic oxide powder as the additive.

17. The method according to claim 15, wherein
the inorganic substrate is a non-crystalline ceramic substrate having a glass component as the main constituent, and
the conductor paste further contains an oxide glass powder as the additive.

18. The method according to claim 14, wherein the inorganic oxide powder is a mixture of bismuth oxide and copper oxide and said mixture is present in an amount in a range of from 0.5 to 5 parts by mass relative to 100 parts by mass of the Ag-based metal powder.

19. The method according to claim 14, wherein the oxide glass powder is present in an amount in a range of from 0.05 to 0.5 parts by mass relative to 100 parts by mass of the Ag-based metal powder.

20. The electronic component according to claim 1, further comprising:
a bonding pad formed on the inorganic substrate;
wherein the bonding wires are directly bonded to the wire bonding sections within at least a part of the conductor film and the bonding pad.

21. The method according to claim 13, wherein:
the electronic component further comprises a bonding pad formed on the inorganic substrate; and
the bonding wires are directly bonded to the wire bonding sections within at least a part of the conductor film and the bonding pad.

22. The conductor paste according to claim 8, wherein the Ag-based metal powder has an average particle diameter in a range of from 2.0 to 6.0 μm.

* * * * *